United States Patent [19]

Hashimoto et al.

[11] Patent Number: 5,023,472
[45] Date of Patent: Jun. 11, 1991

[54] CAPACITOR-DRIVEN SIGNAL TRANSMISSION CIRCUIT

[75] Inventors: Masashi Hashimoto; Oh-Kyong Kwon, both of Garland, Tex.

[73] Assignee: Texas Instruments Incorporated, Dallas, Tex.

[21] Appl. No.: 242,762

[22] Filed: Sep. 9, 1988

[51] Int. Cl.[5] .................. H03K 3/01; H03K 17/687; H03K 19/094; H03K 17/16
[52] U.S. Cl. .................. 307/270; 307/451; 307/443; 307/571; 307/585
[58] Field of Search .............. 307/270, 263, 451, 443, 307/571, 572, 576, 579, 585

[56] References Cited

U.S. PATENT DOCUMENTS

| | | | |
|---|---|---|---|
| 4,622,482 | 11/1986 | Ganger | 307/263 |
| 4,731,553 | 3/1988 | Van Lehn et al. | 307/443 |
| 4,752,703 | 6/1988 | Lin | 307/451 |
| 4,754,170 | 6/1988 | Toda et al. | 307/443 |

FOREIGN PATENT DOCUMENTS 0142061  11/1979  Japan .................. 307/451

Primary Examiner—Stanley D. Miller
Assistant Examiner—Trong Phan
Attorney, Agent, or Firm—James C. Kesterson; James T. Comfort; Melvin Sharp

[57] ABSTRACT

A transmission line driver circuit (10) includes a signal input (12). A first capacitor (28) stores a first voltage level corresponding to a first of two possible bit values of an input signal. A second capacitor (44) stores a second voltage level corresponding to a second of the possible bit values. First and second voltage supply sources (24, 42) are selectively and respectively coupled to the first and second capacitors (28, 44) for recharging these capacitors to their respective voltage levels. A transmission line (50) is coupled to an output of a switching circuit. The switching circuit is operable to couple the first capacitor (28) to the switching circuit output (34) in response to receiving an input signal of a first bit value. The switching circuit is further operable to couple the second capacitor (44) to the output (34) in response to receiving an input signal of a second bit value. The bit value is thereby propagated onto the transmission line (50).

7 Claims, 2 Drawing Sheets 5,023,472

CAPACITOR-DRIVEN SIGNAL TRANSMISSION CIRCUIT

TECHNICAL FIELD OF THE INVENTION

The present invention relates in general to integrated circuit transmission lines and driver circuits therefor, and more particularly to a signal transmission circuit using capacitors to drive the transmission line and a method for using this circuit.

BACKGROUND OF THE INVENTION

Many conventional integrated circuits have their devices organized into different dies that are separated on the semiconductor chip face. The transmission lines running between these dies are sufficiently long that large power sources are required to drive them because of power dissipation.

Commonly, die-to-die signal transmission is achieved by using simple inverters constructed using CMOS architecture. The input signal is inverted by an inverter signal transistor pair in the first die, the inverted transmitted, and then the signal is reinverted at the second die by a second inverter circuit. Each transistor inverted pair have their current paths connected between $V_{dd}$ and $V_{ss}$, with their current paths joined in series.

Conventional signal transmission circuits of this type are susceptible to current spikes appearing on the power supply line. A large current spike makes a large di/dt noise, which can cause mistransmission of the data and a consequent degradation of the system performance. A need has therefore arisen for a signal transmission circuit that insulates the transmission line from the effects of the power supply current spikes.

SUMMARY OF THE INVENTION

One aspect of the invention is directed to a transmission line driver circuit that has a signal input. A first capacitor stores a first voltage level, such as $V_{dd}$, that corresponds to a first of two possible bit values of the input signal. A second capacitor stores a second voltage level, such as $V_{ss}$, that corresponds to a second of the possible bit values. First and second voltage supply sources are selectively and respectively coupled to the first and second capacitors for recharging the capacitors to the respective voltage levels.

A switching circuit receives the signal input and has an output coupled to the transmission line. The switching circuit is operable to couple the first capacitor to the output in response to receiving an input signal of the first value, and is further operable to couple the second capacitor to the output in response to receiving the second bit value. In response to this coupling, the first or the second capacitor transfers its stored voltage level to the transmission line, thus propagating it on the transmission line.

In a further aspect of the invention, a first switch is provided to couple the first voltage source to the first capacitor in response to an input signal of the second bit value appearing on the control node of the first switch. Likewise, a second switch is provided to couple the second capacitor to the second voltage source in response to an input signal of the first bit value appearing on the second switch control node. The switching circuit preferably further includes an inverter that produces an inverted signal responsive to the input signal. This inverted signal is used to actuate a selected one of a pair of third and fourth switches for coupling a respective one of the first and second capacitors to the transmission line. In this manner, one of the driving capacitors is being recharged while the other driving capacitor is transferring its voltage level to the transmission line.

The present invention has a principal advantage in that it insulates the transmission of data on the transmission line from current spikes on the supply source. This is because the capacitors act as the direct driving power supply sources for the transmission line, and are only indirectly and slowly recharged. An additional advantage is that this low di/dt noise signal is made possible without any additional propagation delay. Another advantage of the invention is that the transmission circuit of the present invention has a small power dissipation relative to conventional circuits.

BRIEF DESCRIPTION OF THE DRAWINGS

Further aspects of the invention may be discerned from the following detailed description taken in conjunction with the drawings in which.

DETAILED DESCRIPTION OF THE INVENTION

Figure 1:
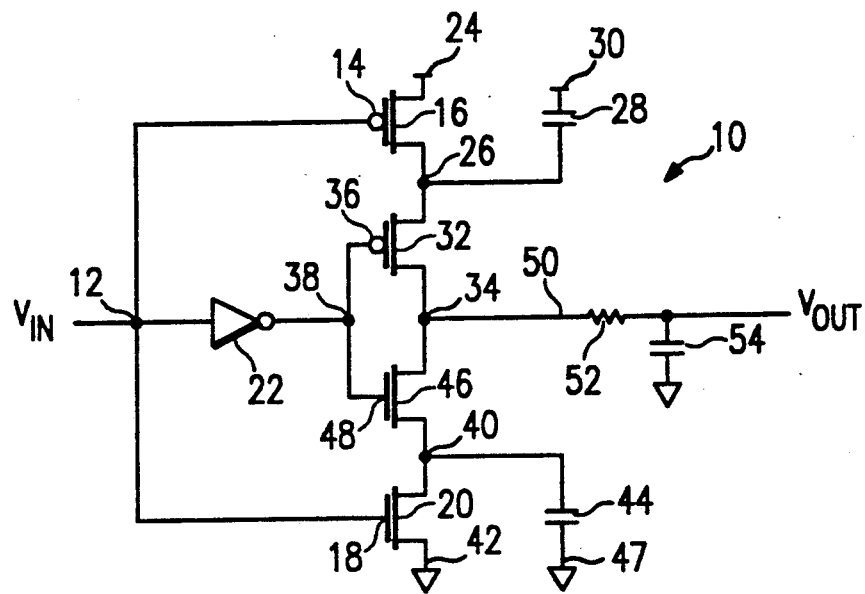
FIG. 1 is a schematic electrical diagram of a basic signal transmission circuit according to the invention.

Referring first to FIG. 1, a basic transmission circuit according to the invention is shown generally at 10. The signal to be transmitted is input on a node 12. Node 12 is connected to the gate 14 of a field effect P-channel transistor 16. Node 12 is also connected to a gate 18 of an N-channel field effect transistor 20. Finally, node 12 is connected to the input of an inverter 22.

The source of transistor 16 is connected to a voltage source 24 such as $V_{dd}$. The drain of transistor 16 is connected to a node 26. A charging capacitor 28 has first electrode thereof connected to a voltage source 30 and a second electrode thereof connected to node 26. The current path of a P-channel field effect transistor 32 is operable to connect node 26 to a transmission node 34. A gate 36 of transistor 32 is connected to a node 38, which in turn is connected to an output of inverter 22.

A current path of the N-channel field effect transistor 20 is operable to connect a node 40 to another voltage source 42 such as $V_{ss}$. A second charging capacitor 44 has a first electrode thereof connected to a voltage source 47, such as $V_{ss}$, and a second electrode thereof connected to node 40. The current path of an N-channel field effect transistor 46 selectively connects transmission line node 34 to node 40. A gate 48 of transistor 46 is connected to inverter output node 38.

Transmission line input node 34 is connected to a transmission line that extends from the first die (in which the circuit is implemented) to a second die (not shown). This transmission line 50 is here shown modelled as having a resistance 52 and a capacitance 54.

Figure 2:
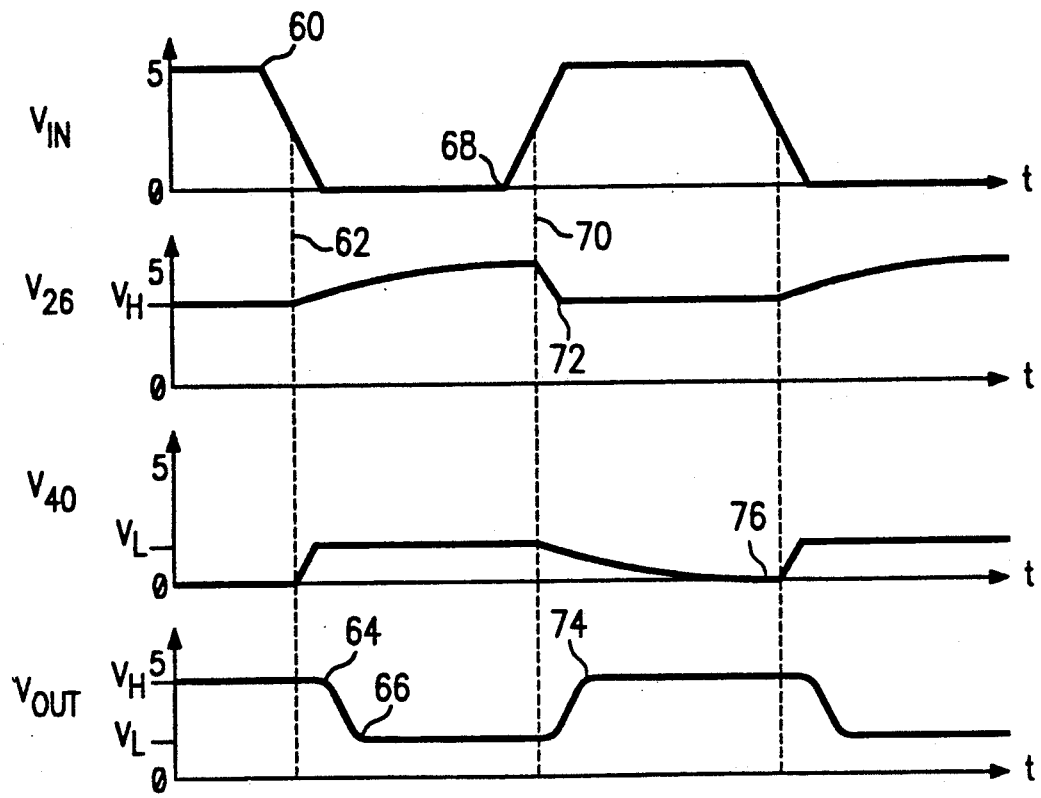
FIG. 2 is a timing diagram showing the operation of the circuit illustrated in FIG. 1.

The operation of the basic circuit illustrated by FIG. 1 can best be explained in conjunction with the timing diagram illustrated by FIG. 2. FIG. 2 is a timing diagram of voltages at four points in the circuit; the input voltage at node 12 ($V_{IN}$); the voltage at node 26 ($v_{26}$); the voltage at node 40 ($V_{40}$); and the output voltage on transmission line 50 ($V_{OUT}$). In the circuit shown, $V_{dd}$ is five volts and $V_{ss}$ is zero volts.

$V_{IN}$ is at five volts at the beginning of the illustrated example. $V_{26}$ is at a $V_H$ level that represents a logic "one". The $V_H$ level is preferably substantially below five volts, but is nevertheless logically distinguishable from a $V_L$ level that is representative of a logic "zero." The voltage at node $V_{40}$ is at $V_{ss}$ or zero volts. The transmission line voltage $V_{OUT}$ starts at $V_H$.

At the beginning, capacitor 44 is charged to zero volts by current drawn through transistor 20, as $V_{IN}$ is high and transistor 20 is turned on. Transistors 16 and 46 are initially turned off.

At time 60, the input signal $V_{IN}$ begins to change. Transistor 16 turns on and transistor 20 turns off at time 62. At the same time, the voltage at node 38 rises from zero to $V_{dd}$. Therefore, transistor 46 turns on and transistor 32 turns off. The voltage at node 40 begins to rise from zero volts to $V_L$ under the influence of the discharging of capacitor 44. Node 34 will therefore begin to be pulled down as a conductive path now exists between charging capacitor 44 and transmission line 50. The state of transmission line 50 becomes $V_L$ at time 66, thereby effectively propagating the low voltage input on node 12 onto the transmission line 50.

Meanwhile, $V_{IN}$ has been impressed on the gate 14 of P-channel transistor 16, thereby coupling voltage source 24 with the charging capacitor 28. Charging capacitor 28 therefore slowly recharges from $V_H$ to a full, five-volt level.

At a time 68, the input waveform again begins to change, reaching the threshold voltage of transistors 16 and 20 and inverter 22 at time 70. At this point, the transistor 46 becomes nonconductive and the transistor 32 conductive. Transistor 16 begins to turn off and the voltage at node 26 drops off to $V_H$ at time 72. Since transistor 32 is conductive, the charge stored on capacitor 28 is partially transferred to the transmission line capacitance represented at 54. This effectively transmits the high signal appearing at node 12 to the transmission line. While this is going on, the input waveform is rendering the charging transistor 20 conductive, thereby drawing the voltage stored on capacitor 44 down to zero volts, which is completed by time 76.

$V_H$ and $V_L$ are given by applying the charge conservation law as:

$$C_{28}(5 - V_H) = C_t(V_H - V_L) = C_{44} V_L \quad (1)$$

therefore, $$V_H = 5 \times \left( \frac{C_{28} C_t + C_{28} C_{44}}{C_{28} C_t + C_t C_{44} + C_{44} C_{28}} \right) \quad (2)$$

$$V_L = 5 \times \left( \frac{C_{28} C_t}{C_{28} C_t + C_t C_{44} + C_{44} C_{28}} \right) \quad (3)$$

where $V_{dd} = 5$ volts; $C_{28}$ is the capacitance of capacitor 28; $C_{44}$ is the capacitance of capacitor 44; and $C_t$ is the capacitance of the transmission line.

The total power dissipation of this circuit per one $V_{IN}$ cycle (for example, 5 volts to 0 volts back to 5 volts) is $$P_t = \frac{1}{2} \times (5)^2 \left( \frac{C_{28} C_t C_{44}}{C_{28} C_t + C_t C_{44} + C_{44} C_{28}} \right)$$

From the above, it can be seen that the power dissipation can be minimized by choosing the allowable minimum $V_H$ and the allowable maximum $V_L$ in the circuit. The low power dissipation is one advantage of the invention. Another is the low di/dt noise due to the relatively slow charging of capacitors 28 and 44. This slow di/dt noise is made possible by the invention without any additional propagation delay.

Since the transmission line 50 is driven by the charge stored either in capacitor 28 or capacitor 44, no direct current flows from the power supply to transmission line 50. By making the transistor conductances of transistors 16 and 20 relatively small in comparison to respective transistors 32 and 46, any current spike appearing at the power supply 24 can be minimized and the signal transfer speed can be maximized.

Figure 3:
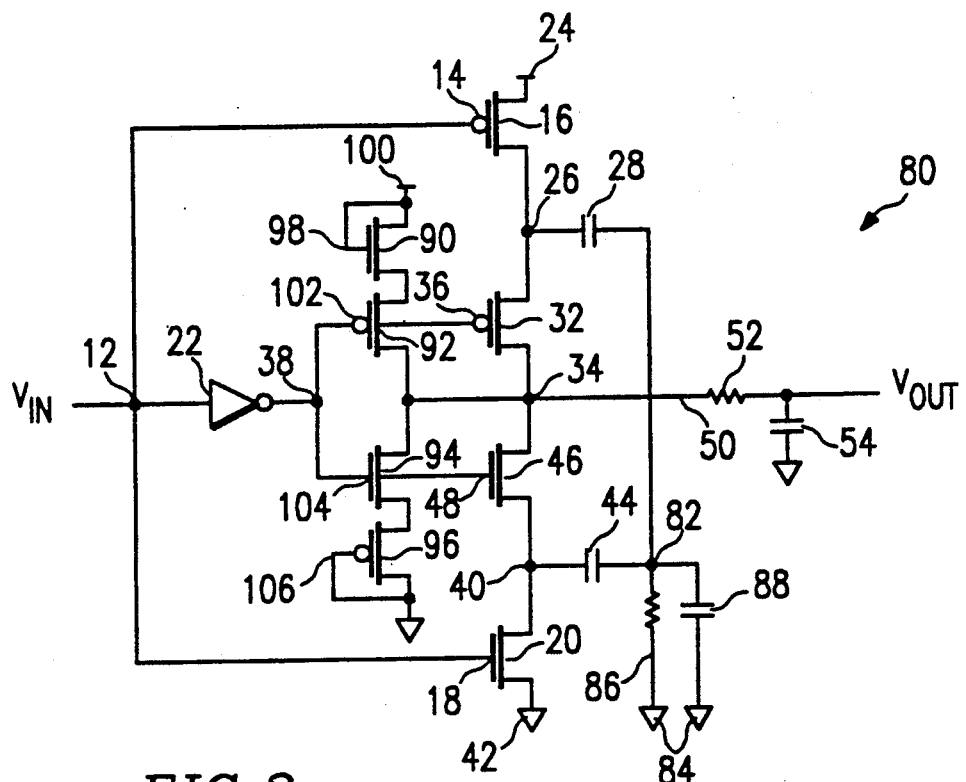
FIG. 3 is a schematic electrical diagram of a practical signal transmission circuit according to the invention.

A practical embodiment of the invention is schematically shown in the electrical circuit diagram of FIG. 3. Throughout the FIGURES, like numbers identify like parts wherever possible. This practical transmission line driven circuit is indicated generally at 80. Circuit 80 is generally similar to circuit 10 (FIG. 1) with the following changes. Capacitor 44 is connected between node 40 and a node 82, which is in turn connected to a voltage source 84, such as $V_{ss}$ or ground, in parallel through both a resistor 86 and a further capacitor 88. Capacitor 28 is connected between node 26 and node 82. A transmission line stabilizing circuit is added in the form of transistors 90, 92, 94 and 96. Transistor 90 is of the N-channel FET type and has its gate 98 shorted to its drain, which is turn connected to a voltage supply 100. The source of transistor 90 is connected to the source of a P-channel transistor 92. Transistor 92 has a drain that is connected to the transmission line node 34. A gate 102 of transistor 92 is connected to the inverter output node 38. A drain of N-channel transistor 94 is connected to transmission line node 34, while a source thereof is connected to the source of a P-channel transistor 96. A gate 104 of transistor 94 is connected to inverter output node 38. A gate 106 of P-channel transistor 96 is shorted to a drain thereof.

In operation, transistors 90 and 96 operate as current sources, while either transistor 92 or transistor 94 will be turned on by the appropriate voltage value appearing at node 38. One of these two transistors 92 and 94 will therefore operate as a current source to stabilize the voltage appearing on transmission line 50, and will therefore tend to compensate for any loss of this transmission line. Capacitors 28 and 44 are connected to node 82, which in turn is connected through a capacitor 88 to ground to reduce AC coupling noise. This AC coupling noise will otherwise occur when capacitor 28 or capacitor 24 discharges with a very high speed. A resistor 86 is connected between node 82 and ground to stabilize the potential of node 82 and therefore the potential on the near electrodes of capacitors 28 and 44.

Figure 4:
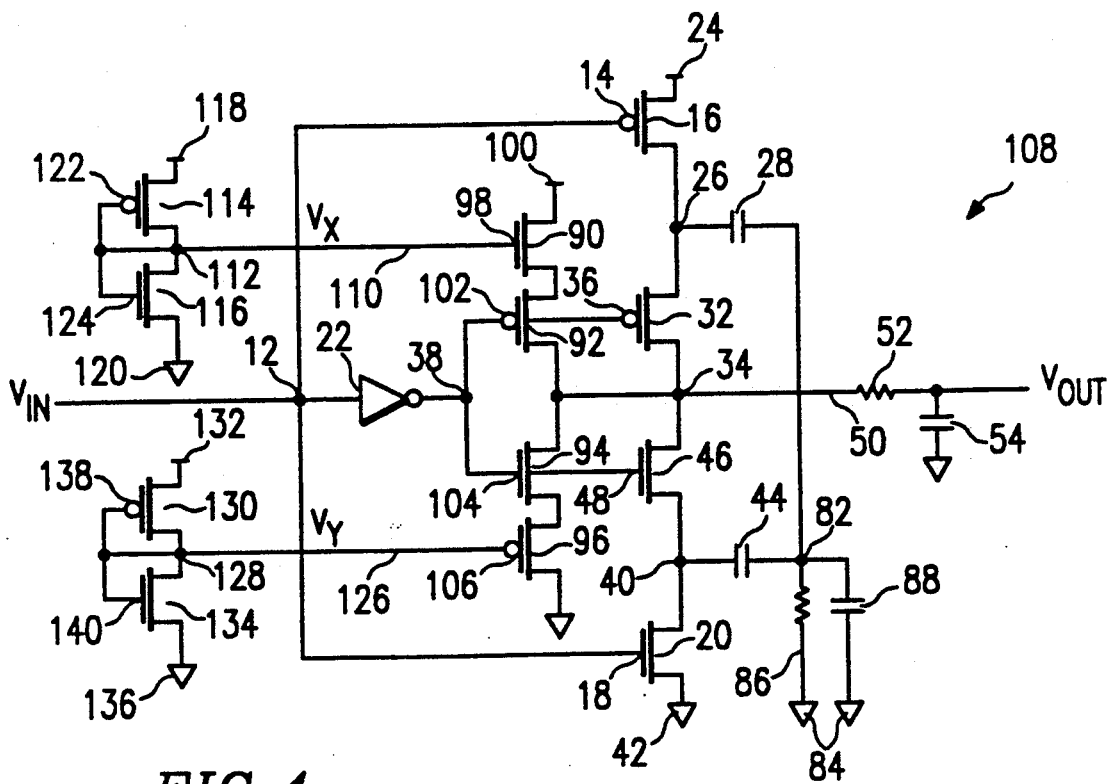
FIG. 4 is an electrical schematic diagram of a second practical circuit according to the invention.

FIG. 4 is a schematic electrical circuit diagram of another practical circuit according to the invention that is in general similar to the circuit illustrated in FIG. 3. This practical circuit is indicated generally at 108. In the embodiment of FIG. 4, the gate 98 of current source transistor 90 is not shorted to the drain thereof but is instead connected through a line 110 to a node 112. The current path of a P-channel transistor 114 is connected between a voltage supply 118 and node 112, and the current path of an N-channel transistor 116 is connected between node 112 and a ground 120. Node 112 is also connected to a gate 122 of transistor 114 and a gate 124 of transistor 116. Clamping circuit transistors 114 and 116 can be fabricated in an area discrete from the remainder of the circuit 108. Therefore, the conductances of transistors 114 and 116 can be precisely adjusted such that a certain biasing voltage $V_x$ will appear on line 110.

Similarly, gate 106 is in this embodiment connected through a line 126 to a node 128. A P-channel transistor 130 has a current path that connects a voltage supply 132 to node 128. An N-channel transistor 134 has a current path that connects node 128 to a ground 136. Node 128 is further connected to a gate 138 of transistor 130, and a gate 140 of transistor 134. As in transistors 114 and 116, transistors 130 and 134 can be fabricated in a discrete area of the slice away from the main circuit 108. The conductances of transistors 130 and 134 can therefore carefully selected to provide a desired biasing voltage $V_y$, which will then turn on transistor 96 by a desired amount.

While two examples of transmission line voltage stabilizing circuits have been shown, other $V_H$ and $V_L$ level clamp circuits can be connected to the main circuit of the invention, such as a conventional diode clamp circuit.

The present invention has been explained as embodied in complementary metal-oxide-semiconductor (CMOS) technology. The present invention has, however, application to other circuit families, such as bipolar, and can be used anywhere where it is desired to propagate a signal on a die-to-die transmission line using slow-replenishing capacitors rather than a voltage supply that may be prone to current spikes.

In summary, several embodiments of a signal transmission circuit has been shown and described that yield the advantages of low di/dt noise with a minimum of additional propagation delay. The present invention is nevertheless not limited to these embodiments but only by the spirit and scope of the appended claims.

What is claimed is:

1. A transmission line driver circuit, comprising:
   a signal input;
   a first capacitor for storing a first voltage level corresponding to a first of two possible bit values of an input signal;
   a second capacitor for storing a second voltage level corresponding to a second of said possible bit values of said input signal;
   a first voltage supply source selectively coupled to said first capacitor for recharging said first capacitor to said first voltage level;
   a second voltage supply source selectively coupled to said second capacitor for recharging said second capacitor to said second voltage level;
   a transmission line; and
   a switching circuit, an input of said switching circuit coupled to said signal input, an output of said switching circuit coupled to said switching circuit, said switching circuit comprising an inverter coupled to said signal input and having an output, said inverter being operable to invert said input signal to produce an inverted signal on said inverter output having a bit value inverted from the bit value of said input signal, first and second capacitor coupling switches, each having control nodes coupled to said output of said inverter, said first capacitor coupling switch being operable to couple said capacitor to said transmission line in response to a second bit value of said inverter signal in its switch control node, said second capacitor coupling switch being operable to couple said second capacitor to said transmission line in response to receiving a first bit value of said inverted signal on its switch control node, said switching circuit being operable to couple said first capacitor to said output in response to an input signal of a first bit value and being operable to couple said second capacitor to said output in response to an input signal of said second bit value, such that the bit value received on said signal input is transmitted to said transmission line.

2. A circuit for transmitting a bivalent signal on a transmission line, comprising:
   a signal input for receiving an input signal having one of two opposed bit values;
   an inverter coupled to said signal input and having an inverter output operable to output an inverted signal having a bit value opposite that of said input signal;
   a first voltage source for supplying a first voltage corresponding to a first of said bit values;
   a second voltage source for supplying a second voltage corresponding to a second of said bit values;
   a first switch having a control node coupled to said signal input, a first capacitor, said first switch operable to couple said first voltage source to said first capacitor responsive to a signal of said second bit value appearing on said control node;
   a second switch having a control node coupled to said signal input, a second capacitor, said second switch operable to couple said second voltage source to said second capacitor responsive to a signal of said first bit value appearing on the last said control node;
   a transmission line node, a third switch having a control node coupled to said inverter output, said third switch operable to couple said first capacitor to said transmission line node in response to said control node of said third switch receiving an inverter signal of said first bit value;
   a fourth switch having a control node coupled to said inverter output, said fourth switch operable to couple said second capacitor to said transmission line node in response to said control node of said fourth switch receiving an inverted signal of said second bit value, such that one of said capacitors transfers charge to said transmission line while the other of said capacitors is being recharged from a corresponding one of said voltage sources; and
   a voltage stabilizer circuit for stabilizing the bit value transmitted on the transmission line, said voltage stabilizer circuit comprising a first and second stabilizer switches having respective control nodes coupled to said inverter output, said first stabilizer switch operable to couple a first stabilizing voltage supply source to said transmission line in response to receiving a second bit value of said inverter signal on its control node, said second stabilizer switch operable to couple a second stabilizing voltage source to said transmission line in response to receiving a first bit value of said inverter signal on its control node, said first and second stabilizing voltage supply sources each comprise a transistor having a control electrode and a current path, each said current path coupling a respective voltage source to a respective stabilizer switch, the control electrode of each said transistor coupled to a respective voltage source.

3. A circuit for transmitting a bivalent signal on a transmission line, comprising:

a signal input for receiving an input signal having one of two opposed bit values;

an inverter coupled to said signal input and having an inverter output operable to output an inverted signal having a bit value opposite that of said input signal;

a first voltage source for supplying a first voltage corresponding to a first of said bit values;

a second voltage source for supplying a second voltage corresponding to a second of said bit values;

a first switch having a control node coupled to said signal input, a first capacitor, said first switch operable to couple said first voltage source to said first capacitor responsive to a signal of said second bit value appearing on said control node;

a second switch having a control node coupled to said signal input, a second capacitor, said second switch operable to couple said second voltage source to said second capacitor responsive to a signal of said first bit value appearing on said control node;

a transmission line node, a third switch having a control node coupled to said inverter output, said third switch operable to coupled said first capacitor to said transmission line node in response to said control node of said third switch receiving an inverter signal of said first bit value;

a fourth switch having a control node coupled to said inverter output, said fourth switch operable to couple said second capacitor to said transmission line node in response to said control node of said fourth switch receiving an inverted signal of said second bit value, such that one of said capacitors transfers charge to said transmission line while the other of said capacitors is being recharged from a corresponding one of said voltage sources; and a voltage stabilizer circuit for stabilizing the bit value transmitted on the transmission line, said voltage stabilizer circuit comprising a first and second stabilizer switches having respective control nodes coupled to said inverter output, said first stabilizer switch operable to couple a first stabilizing voltage supply source to said transmission line in response to receiving a second bit value of said inverter signal on its control node, said second stabilizer switch operable to couple a second stabilizing voltage source to said transmission line in response to receiving a first bit value of said inverter signal on its control node, said first and second stabilizing voltage supply sources each comprise a transistor having a current path coupling a respective voltage source to a respective voltage stabilizer switch, at least two stabilizing input signals, a control electrode of each said transistor coupled to a respective stabilizing input signal for controlling the conductance of said current path.

4. A circuit for transmitting a bivalent signal on a transmission line, comprising:

a signal input for receiving an input signal having one of two opposed bit values;

an inverter coupled to said signal input and having an inverter output operable to output an inverted signal having a bit value opposite that of said input signal;

a first voltage source for supplying a first voltage corresponding to a first of said bit values;

a second voltage source for supplying a second voltage corresponding to a second of said bit values;

a first switch having a control node coupled to said signal input, a first capacitor, said first switch operable to couple said first voltage source to said first capacitor responsive to a signal of said second bit value appearing on said control node;

a second switch having a control node coupled to said signal input, a second capacitor, said second switch operable to couple said second voltage source to said second capacitor responsive to a signal of said first bit value appearing on said control node;

a transmission line node, a third switch having a control node coupled to said inverter output, said third switch operable to couple said first capacitor to said transmission line node in response to said control node of said third switch receiving an inverter signal of said first bit value;

a fourth switch having a control node coupled to said inverter output, said fourth switch operable to couple said second capacitor to said transmission line node in response to said control node of said fourth switch receiving an inverted signal of said second bit value, such that one of said capacitors transfers charge to said transmission line while the other of said capacitors is being recharged from a corresponding one of said voltage sources, a first electrode of said first capacitor being coupled to said first and third switches, a first electrode of said second capacitor coupled to said second and fourth switches;

a third capacitor; and a second electrode of said first and second capacitors opposed to a respective first electrode coupled to ground through said third capacitor to reduce AC coupling noise.

5. A circuit for transmitting a bivalent signal on a transmission line, comprising:

a signal input for receiving an input signal having one of two opposed bit values;

an inverter coupled to said signal input and having an inverter output operable to output an inverted signal having a bit value opposite that of said input signal;

a first voltage source for supplying a first voltage corresponding to a first of said bit values;

a second voltage source for supplying a second voltage corresponding to a second of said bit values;

a first switch having a control node coupled to said signal input, a first capacitor, said first switch operable to couple said first voltage source to said first capacitor responsive to a signal of said second bit value appearing on said control node;

a second switch having a control node coupled to said signal input, a second capacitor, said second switch operable to couple said second voltage source to said second capacitor responsive to a signal of said first bit value appearing on the last said control node;

a transmission line node, a third switch having a control node coupled to said inverter output, said third switch operable to couple said first capacitor to said transmission line node in response to said control node of said third switch receiving an inverter signal of said first bit value;

a fourth switch having a control node coupled to said inverter output, said fourth switch operable to couple said second capacitor to said transmission line node in response to said control node of said fourth switch receiving an inverted signal of said second bit value, such that one of said capacitors transfers charge to said transmission line while the other of said capacitors is being recharged from a corresponding one of said voltage sources, a first electrode of said first capacitor being coupled to said first and third switches, a first electrode of said second capacitor coupled to said second and fourth switches;

a third capacitor; and a second electrode of said first and second capacitors being opposed to a respective first electrode coupled to ground through said third capacitor to reduce AC coupling noise and a resistance coupled between said second electrodes of said first and second capacitors on the one hand and ground on the other hand to stabilize the potential at said second electrodes.

6. A method for transmitting a bivalent signal on a transmission line, comprising the steps of:

applying the signal to each of a pair of first coupling transistors of opposed conductivity types;

rendering the current path of one of the first coupling transistors conductive in response to applying the signal;

charging a first capacitor to a preselected signal voltage corresponding to a bit value opposite the current bit value of the signal through the current path of the first coupling transistor;

inverting the signal;

applying the inverted signal to each of a pair of second coupling transistors of opposed conductivity types;

rendering a current path of one of the second coupling transistors conductive in response to applying the inverted signal;

discharging a second capacitor for a second preselected signal voltage representing a bit value equal to that of the signal through the current path of the one of the second coupling transistors to a transmission line;

using the charge discharged from the second capacitor to transmit the signal on the transmission line; and coupling electrodes of said first and second capacitors from said coupling transistors to ground through a third capacitor to reduce AC coupling noise.

7. The method of claim 6, and further comprising the step of coupling the electrodes of the first and second capacitors to ground through a resistance in order to stabilize the potential on said electrodes.

* * * * *